(12) United States Patent
Kim et al.

(10) Patent No.: US 10,325,672 B2
(45) Date of Patent: Jun. 18, 2019

(54) MEMORY APPARATUS HAVING PLURALITY OF INFORMATION STORAGE TABLES MANAGED BY SEPARATE VIRTUAL REGIONS AND CONTROL METHOD THEREOF

(71) Applicant: Korea University Research and Business Foundation, Seoul (KR)

(72) Inventors: Seon Wook Kim, Gyeonggi-do (KR); Ho Kwon Kim, Gyeonggi-do (KR); Jae Yung Jun, Seoul (KR); Kyu Hyun Choi, Seoul (KR); Young Sun Han, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/486,932

(22) Filed: Apr. 13, 2017

(65) Prior Publication Data

US 2018/0047459 A1  Feb. 15, 2018

(30) Foreign Application Priority Data

Aug. 9, 2016 (KR) .................. 10-2016-0101106

(51) Int. Cl.
*G06F 11/07* (2006.01)
*G06F 11/16* (2006.01)
*G11C 29/00* (2006.01)
*G11C 8/10* (2006.01)
*G11C 29/52* (2006.01)

(52) U.S. Cl.
CPC .............. *G11C 29/76* (2013.01); *G11C 8/10* (2013.01); *G11C 29/52* (2013.01)

(58) Field of Classification Search
CPC .............. G06F 11/073; G06F 11/2094; G06F 11/1666; G06F 11/167; G06F 11/3037; G06F 12/0292; G06F 12/08; G06F 2212/1016; G06F 2212/1044; G06F 2212/657; G11C 29/52; G11C 29/76; G11C 8/10; G11C 29/808
See application file for complete search history.

(56) References Cited

U.S. PATENT DOCUMENTS 9,405,478 B2 *   8/2016  Koseki ................ G06F 3/0616
2015/0378935 A1 * 12/2015 Lin .................. G06F 17/30336
                                                        711/159
2017/0371753 A1 * 12/2017 Kim ..................... G06F 11/073

* cited by examiner

*Primary Examiner* — Phung M Chung
(74) *Attorney, Agent, or Firm* — Fox Rothschild LLP

(57) ABSTRACT

Disclosed are a memory apparatus having a plurality of information storage tables managed by separate virtual regions and a control method thereof. That is, a fault repair is applied in a memory system having a plurality of information storage tables managed by a separate virtual region, so that the entire information storage space is uniformly used for every region to improve a performance of the entire system and maximize efficiency of the information storage space by utilizing the information storage space.

22 Claims, 9 Drawing Sheets

MEMORY APPARATUS HAVING PLURALITY OF INFORMATION STORAGE TABLES MANAGED BY SEPARATE VIRTUAL REGIONS AND CONTROL METHOD THEREOF

CROSS-REFERENCE TO RELATED APPLICATION

This application claims the benefit of Korean Application No. 10-2016-0101106 filed on Aug. 9, 2016 with the Korean Intellectual Property Office, the disclosure of which is incorporated herein by reference.

BACKGROUND

1. Field of the Invention

The present solution relates to a memory apparatus and a control method thereof, and more particularly, to a memory apparatus which applies fault repair in a memory system having a plurality of information storage tables managed by separate virtual regions and a control method thereof.

2. Description of the Related Art

In a memory system configured by a plurality of subarrays, fault repair may be performed using one or more of spare rows and spare columns in the unit of subarrays.

In this system, when a lot of faults are generated in the specific subarray, a storage space in which information on the fault position is to be stored is insufficient so that it may be difficult to repair the fault with the structure of the related art in which spare cell mapping information is stored.

In order to solve the above-mentioned problem, there is provided a memory apparatus which maps the unit regions to physical basic regions, checks combination of virtual basic regions satisfying a predetermined target value among all configurable combinations while dividing each of the mapped physical basic regions into a plurality of physical sub regions having same size, and stores position information related to the combination of the virtual basic regions satisfying the target value and the fault position information corresponding thereto in an information storage table.

However, the above-mentioned system has a problem in that when several faults are caused in one column in a physical basic region, the physical basic region is divided into a plurality of physical sub regions and then combined into a virtual basic region, which may occupy several entries of the information storage table managed by the virtual basic region.

SUMMARY

An object of the present solution is to provide a memory apparatus and a control method thereof which apply fault repair in a memory system having a plurality of information storage tables managed by separate virtual regions.

Another object of the present solution is to provide a memory apparatus and a control method thereof which, when a column fault is caused over several physical regions, stores fault information in a plurality of information storage tables managed by a combination of separate virtual regions by using a plurality of information storage tables.

According to an aspect of the present solution, there is provided a control method of a memory apparatus having a plurality of information storage tables. The control method includes: receiving a memory request transmitted from a device, by means of a data input/output unit; converting a physical basic region address into a plurality of virtual basic region addresses based on an input address included in the memory request and a plurality of position information vectors stored in a storage region set in a storage medium, by means of an address converter,; checking spare cell information which replaces a fault address in a fault address storage space of the storage medium based on the plurality of converted virtual basic region addresses, a plurality of column addresses or row addresses set in advance in the storage medium, and the input address, by means of an information providing unit; selecting a final address based on the checked spare cell information which replaces the fault address, the plurality of column addresses or row addresses set in advance in the storage medium, and the input address, by means of the information providing unit; providing position information of data corresponding to the final address, by means of an address decoder; and performing any one of a read command function and a write command function included in the memory request, based on the position information of the data corresponding to the final address and the memory request, by means of a memory cell.

In some scenarios, the memory request may include at least one of an input address, a command and write data.

In those or other scenarios, the converting of a physical basic region address into a plurality of virtual basic region addresses may include: generating a plurality of virtual basic region addresses corresponding to the plurality of information storage tables based on the input address and the plurality of position information vectors, by means of the address converter; and obtaining information by approaching entries of the plurality of information storage tables in the storage medium based on the generated plurality of virtual region addresses, by means of the address converter.

In those or other scenarios, the spare cell information which replaces the fault address may be any one of information on a spare column which replaces the fault address and information on a spare row which replaces the fault address.

In those or other scenarios, in the checking of spare cell information which replaces the fault address, the input address is replaced to an address of a spare cell from the fault address so that the fault is repaired by accessing the address of the spare cell instead of the fault address.

In those or other scenarios, in the checking of spare cell information which replaces the fault address, in a case of fault repair using a spare row, the fault address is replaced by an address of a spare row which belongs to a physical address region, and in a case of fault repair using a spare column, the fault address is replaced by an address of a spare column which belongs to a virtual address region.

In those or other scenarios, the selecting of a final address may include any one of: selecting, when the input address is any one of the plurality of predetermined column addresses and row addresses, a value obtained by replacing the fault address by an address of a spare cell as the final address, by means of the information providing unit; and selecting, when the input address is not the fault address, the input address as the final address, by means of the information providing unit.

In those or other scenarios, the providing of position information of data corresponding to the final address may include any one of providing, when the final address is a value obtained by replacing the fault address by an address of the spare cell, position information of data corresponding to an address of the spare cell; and providing, when the final address is the input address, position information of data corresponding to the input address.

In those or other scenarios, in the performing of any one of a read command function and a write command function included in the memory request, when the read command is included in the memory request, data to be output to the outside related with the position information of data corresponding to the final address may be read from a position corresponding to position information of the data in the memory cell.

In those or other scenarios, in the performing of any one of a read command function and a write command function included in the memory request, when the write command is included in the memory request, the write data may be stored in the memory cell based on the write data included in the memory request and the position information of data corresponding to the final address.

In those or other scenarios, the control method may further include: temporarily storing, when the read command is included in the memory request, data corresponding to the input address output from the memory cell, by means of the data input/output unit; and providing data corresponding to the temporarily stored input address to the device which requests the data, by means of the data input/output unit.

In those or other scenarios, the control method may further include: outputting a physical basic region address configured by the input address or a part of the input address to information storage table managed by a physical region in which the position information vector is not presented, by means of the address converter, without performing the address converting process of converting the physical basic region address into the plurality of virtual basic region addresses; and checking spare cell information which replaces a fault address in a fault address storage space of the storage medium based on the physical basic region address, a plurality of column addresses or row addresses set in advance in the storage medium, and the input address, by means of the information providing unit.

According to another aspect of the present solution, there is provided a memory apparatus having a plurality of information storage tables. The memory apparatus includes: a data input/output unit which receives a memory request transmitted from a device; an address converter which converts a physical basic region address into a plurality of virtual basic region addresses based on an input address included in the memory request and a plurality of position information vectors stored in a storage region set in a storage medium; an information providing unit which checks spare cell information which replaces a fault address in a fault address storage space of the storage medium based on the converted virtual basic region address, a plurality of column addresses or row addresses set in advance in the storage medium, and the input address and selects a final address based on the checked spare cell information which replaces the fault address, the plurality of column address or row addresses set in advance in the storage medium, and the input address; an address decoder which provides position information of data corresponding to the final address; and a memory cell which performs any one of a read command function and a write command function included in the memory request, based on the position information of the data corresponding to the final address and the memory request.

In some scenarios, the memory request may include at least one of an input address, a command, and write data.

In those or other scenarios, the address converter may generate a plurality of virtual basic region addresses corresponding to the plurality of information storage tables based on the input address and the plurality of position information vectors and approach entries of the plurality of information storage tables in the storage medium based on the plurality of generated virtual region addresses to obtain information.

In those or other scenarios, when the input address is any one of the plurality of predetermined column addresses and row addresses, the information providing unit may select a value obtained by replacing the fault address by an address of a spare cell as a final address.

In those or other scenarios, when the input address is not the fault address, the information providing unit may select the input address as the final address.

In those or other scenarios, when the final address is a value obtained by replacing the fault address by an address of the spare cell, the address decoder may provide position information of data corresponding to the address of the spare cell to the memory cell.

In those or other scenarios, when the final address is the input address, the address decoder may provide position information of data corresponding to the input address to the memory cell.

In those or other scenarios, when the read command is included in the memory request, the memory cell may read data to be output to outside related with the position information of data corresponding to the final address from a position corresponding to position information of the data in the memory cell.

In those or other scenarios, when the write command is included in the memory request, the memory cell may store the write data based on the write data included in the memory request and the position information of data corresponding to the final address.

In those or other scenarios, when the read command is included in the memory request, the data input/output unit may temporarily store data corresponding to the input address output from the memory cell and provide the data corresponding to the temporarily stored input address to the device which requests the data.

In those or other scenarios, the address converter may output a physical basic region address configured by the input address or a part of the input address to information storage table managed by a physical region in which the position information vector is not presented, without performing the address converting process of converting the physical basic region address into the plurality of virtual basic region addresses; and the information providing unit may check spare cell information which replaces a fault address in a fault address storage space of the storage medium based on the physical basic region address, a plurality of column addresses or row addresses set in advance in the storage medium, and the input address.

According to the present solution, a fault repair is applied in a memory system having a plurality of information storage tables managed by separate virtual regions, so that the entire information storage space is uniformly used for every region to improve a performance of the entire system and maximize efficiency of the information storage space by utilizing the information storage space.

Further, when a column fault is caused over several physical sub regions by using the plurality of information storage tables, fault information is stored in the plurality of information storage tables managed by combinations of separate virtual regions, thereby improving efficiency of fault repair and increasing a fault repair rate of the memory system.

DETAILED DESCRIPTION

Figure 1:
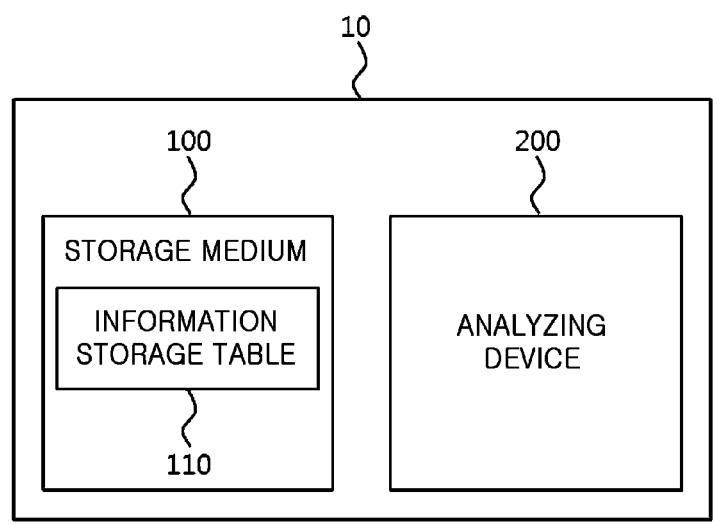
FIG. 1 is a block diagram illustrating a configuration of an entire analyzing system configured by an information storage table configured by a plurality of unit regions and an analyzing device which finds out optimal information storage.

It should be noted that technical terminologies used in the present invention are used to describe a specific exemplary embodiment but are not intended to limit the present invention. Further, the technical terminologies which are used in the present invention should be interpreted to have meanings that are generally understood by those with ordinary skill in the art to which the present invention pertains, unless specifically defined to have different meanings in the present invention, but not be interpreted as an excessively comprehensive meaning or an excessively restricted meaning. Further, if a technical terminology used in the present invention is an incorrect technical terminology which does not precisely describe the spirit of the present invention, the technical terminology should be replaced with and understood as a technical terminology which may be correctly understood by those skilled in the art. Further, a general terminology used in the present invention should be interpreted as defined in a dictionary or in accordance with the context, but not be interpreted as an excessively restricted meaning.

A singular form used in the present invention may include a plural form unless it has a clearly opposite meaning in the context. Terminologies such as "be configured by" or "include" in the present invention should not be interpreted to necessarily include all of plural components or plural steps described in the present invention, but should be interpreted not to include some of the components or steps or to further include additional components or steps.

Further, terminologies including an ordinal number such as first or second which is used in the present invention may be used to explain components, but the components are not limited by the terminologies. The terminologies are used only for distinguishing one component from another component. For example, without departing from the scope of the present invention, the first component may be referred to as the second component, and similarly, the second component may also be referred to as the first component.

Hereinafter, the present solution will be described in detail with reference to the accompanying drawings, and the same or similar components are denoted by the same reference numerals regardless of reference numerals, and repeated description thereof will be omitted.

In describing the present disclosure, when it is determined that a detailed description of a related publicly known technology may obscure the gist of the present disclosure, the detailed description thereof will be omitted. Further, it should be noted that the accompanying drawings are used just for easily appreciating the spirit of the present disclosure and it should not be interpreted that the spirit of the present disclosure is limited by the accompanying drawings.

FIG. 1 is a block diagram illustrating a configuration of an entire analyzing system 10 configured by an information storage table configured by a plurality of unit regions and an analyzing device which finds out optimal information storage according.

As illustrated in FIG. 1, the analyzing system 10 includes a storage medium 100 and an analyzing device 200. However, all the components of the analyzing system 10 illustrated in FIG. 1 are not essential components, but the analyzing system 10 may be implemented by more components or less components than the components illustrated in FIG. 1.

The storage medium 100 may be any one of a dynamic random access memory (DRAM), a random access memory (RAM), a static random access memory (SRAM), a read-only memory (ROM), an electrically erasable programmable read-only memory (EEPROM), a programmable read-only memory (PROM), a phase change memory (PCM), and a magnetoresistance random access memory (MRAM).

Further, the storage medium 100 includes an information storage table 110.

The information storage table 110 includes information related with one or more of physical regions (or address information related with one or more of physical regions), information related with one or more of virtual regions (or address information related with one or more of virtual regions), and data (or information). Here, the information related with the one or more of physical regions includes position information of one or more of physical basic regions and position information of one or more of physical sub regions. Here, the information related with the one or more of virtual regions includes position information of one or more of virtual basic regions and position information of one or more of virtual sub regions. In this case, the data (or information) includes fault information, position information of a fault, routing information, and packet information. Further, the data (or information) may vary depending on a field (for example, including a memory field or a data communication field) to which the analyzing system 10 is applied and may be applied by being modified by a design of a designer. For example, in the case of a memory system which applies a memory repair using a redundant cell, the data (or information) may be a position (or position information) of a fault cell which is replaced by a spare cell which is provided in the memory system.

The analyzing device 200 performs an overall control function of the analyzing system 10.

Further, the analyzing device 200 finds out an optimal information storage location (or position information of K bits and position information of M+N−K bits which satisfy a predetermined target value) of the analyzing system 10 and allocates the position information of K bits and the position information of M+N−K bits corresponding to the found optimal information storage location to the analyzing system 10.

The analyzing device 200 selects one or more information storage tables to be analyzed (or managed) from the plurality of information storage tables 110.

Further, the analyzing device 200 determines (or checks) whether the selected information storage table is an information storage table managed by physical basic regions or an information storage table managed by virtual basic regions.

As a determining result (or a checking result), when the selected information storage table is an information storage table managed by virtual basic regions, the analyzing device 200 maps information management unit regions (or unit regions) hashing the information storage location to physical basic regions in the information storage table (or the selected information storage table managed by the virtual basic regions) 110. Here, the information storage table (or the selected information storage table managed by the virtual basic regions) 110 is included in the storage medium 100 and configured by a plurality of unit regions.

In this case, when unit regions in which the information is to be stored and managed in the memory system such as a DRAM, a PCM, an MRAM, or a SRAM are banks, the analyzing device 200 combines all rows in one bank or a plurality of subarrays, divides all the combined rows into 2M physical basic regions, and maps the unit regions to the divided 2M physical basic regions.

Further, when the number of unit regions to be managed in the storage medium 100 is not 2M, the analyzing device 200 may make a plurality of unit regions in the storage medium 100 to be 2M, and then map the 2M unit regions to the 2M physical basic regions. Here, M may be a natural number.

That is, in order to configure 2M unit regions according to the design of the designer, when the number of unit regions is not 2M, the analyzing device 200 performs a preprocessing process of mapping existing unit regions to 2M new unit regions according to the design of the designer and maps the 2M preprocessed unit regions to the 2M physical basic regions.

Further, the analyzing device 200 divides each of the plurality of physical basic regions in the storage medium 100 (or the information storage table/the selected information storage table 110 managed by the virtual basic regions) into a plurality of physical sub regions. Each of the physical sub regions has same size.

That is, the analyzing device 200 divides each of the 2M physical basic regions in the storage medium 100 (or the information storage table/the selected information storage table 110 managed by the virtual basic region) into 2N physical sub regions having same size. Here, N may be a natural number. In this case, when one physical basic region is divided into N physical sub regions to be hashed, an additional bit may be required to index the physical sub regions.

Further, the analyzing device 200 combines (or configures) 2M+N physical sub regions indexed by M+N bits to generate 2K virtual basic regions. In this case, K is a natural number and may be equal to or smaller than M+N. Here, when bits for approaching the physical basic region are M bits and bits for approaching the physical sub region are N bits, a number of combinationable cases to generate the virtual basic region is M+NCM+N−K. Further, the size of K may be a bit rate to approach the information storage table 110.

Further, the analyzing device 200 divides (or resets) the generated 2K virtual basic regions into 2M+N−K virtual sub regions having same size.

That is, the analyzing device 200 combines the physical sub regions and sets a key value of the virtual basic regions in the unit of bit which is set in advance from the most significant bit to the least significant bit and sets a bit (or a remaining region) remaining after setting the key value of the virtual basic regions among the M+N bits as a key value of the virtual sub regions to configure the key of the entire virtual regions. The entire virtual regions include virtual basic regions and virtual sub regions. Here, the analyzing device 200 generates position information of K bits for obtaining the key value of the virtual basic regions and position information of M+N−K bits for obtaining the key value of the virtual sub regions, in order to configure the key (or a key of the entire virtual regions) of the virtual regions.

As described above, when the selected information storage table is an information storage table managed by the virtual basic regions, the analyzing device 200 may configure a hash function for obtaining (or setting) the key value of the virtual basic regions using the position information of K bits among the M+N bits and for obtaining the key value of the virtual sub regions using position information of a bit remaining after setting the key value of the virtual basic regions among the M+N bits. Here, the hash function provides position information (for example, including position information of K bits and position information of M+N−K bits) related with the virtual regions based on physical regions addresses.

Further, as the determining result (or the checking result), when the selected information storage table is an information storage table managed by the physical basic regions, the analyzing device 200 may approach the information storage table using an address of the physical basic region as it is, without performing the preprocessing process and the mapping process on the information storage table managed by the virtual basic regions regardless of the number of physical basic regions.

Further, the analyzing device 200 checks whether the number of information (or the number of combined/recombined information) to be stored in the physical basic regions (or when the selected information storage table is an information storage table managed by the physical basic regions) or a temporarily combined (or configured) virtual basic regions (or when the combination of virtual basic regions/the selected information storage table is an information storage table managed by the virtual basic regions) satisfies a predetermined target value. Here, the target value is a value (or a value to satisfy the information to be stored) which is set in advance corresponding to information to be stored. In the case of a memory system which applies memory repair (or memory recovery) using a redundant cell, the target value may be a predetermined number (including, for example, a number of spare rows and a number of spare columns) which is the same with the number of available (or available in the memory system) spare cells which are provided in the memory system. That is, the target value may be same with the number of resources which may be available in all of the mapped physical basic regions with a predetermined value corresponding to the information to be stored. Further, in the case of a memory system which avoids a fault memory block, the target value may be same with the number of memory blocks which are available in all of the physical regions of the memory system.

As the checking result, when the number of information to be stored in the selected information storage table satisfies the target value, the analyzing device 200 stores data corresponding to the position information of the virtual regions (or position information on the virtual regions) or the position information of the physical regions (or position information on the physical regions) in the information storage table 110 based on the position information vector stored in a predetermined storage region in the storage medium 100 or the addresses of the physical basic regions. Here, the data (or information) includes fault information, position information of a fault, routing information, and packet information. Further, the data (or information) may vary depending on a field (for example, including a memory field or a data communication field) to which the analyzing system 10 is applied and may be applied by being modified by a design of a designer. For example, in the case of a memory system which applies a memory repair using a redundant cell, the data (or information) may be a position (or position information) of a fault cell which is replaced by a spare cell which is provided in the memory system.

That is, as the checking result, when the number of information to be stored in the physical basic regions (or when the selected information storage table is an information storage table managed by the physical basic regions) satisfies the target value, the analyzing device 200 stores data corresponding to the position information (or the position information on the physical region) of the physical region based on the address of the physical basic region.

Further, as the checking result, when the number of information (or the number of combined/recombined information) to be stored in the temporarily combined virtual basic regions (or when the combination of the virtual basic regions/the selected information storage table is an information storage table managed by the virtual basic regions) satisfies the target value, the analyzing device 200 stores position information of K bits related with the virtual basic region which satisfies the target value and position information of M+N−K bits related with the virtual sub region which satisfies the target value, among the M+N bits in a predetermined (or previously allocated) storage region in the storage medium 100. Here, a value of the position information of K bits and a value of the position information of M+N−K bits are configured as vectors and positions of the bits are configured by "0" (or K bits) corresponding to the key value (or a position of K bits) of the virtual basic region and "1" (or M+N−K bits) corresponding to the key value (or a position of M+N−K bits) of the virtual sub region. The vector type position information is defined as a position information vector.

That is, when the number of information (or the number of combined/recombined information) to be stored in the combined (or configured/generated) virtual basic regions (or when a combination of the virtual basic regions/the selected information storage table is an information storage table managed by the virtual basic regions) satisfies a predetermined target value, the analyzing device 200 generates a position of K bits corresponding to the virtual basic regions which satisfies the target value and a position of M+N−K bits corresponding to the virtual sub regions which satisfies the target value, among the M+N bits. Further, the analyzing device 200 stores the generated position (or position information of K bits) of K bits and the generated position (or position information of M+N−K bits) of M+N−K bits as vectors in a predetermined storage region in the storage medium 100.

Further, as the checking result, when the number of information to be stored in the physical basic regions (or the selected information storage table is an information storage table managed by the physical basic regions) does not satisfy the target value, the analyzing device 200 determines that the information storage table (or the information storage table managed by the physical basic region) cannot be stored (or the information storage table 110 cannot be successfully managed) and ends the entire processes.

Further, as the checking result, when the number of information (or the number of combined/recombined information) to be stored in the temporarily combined virtual basic regions (or when the combination of the virtual basic regions/the selected information storage table is an information storage table managed by the virtual basic regions) does not satisfy the target value, the analyzing device 200 repeatedly performs a process of recombining the plurality of physical sub regions according to a predetermined hashing method (or based on a predetermined hash function/with respect to another position of K bits) to check the recombined virtual basic regions and checking whether the number of information to be stored in the checked recombined virtual basic regions satisfies the predetermined target value except a previously combined case (a plurality of combined cases according to the hashing method/the plurality of recombined cases) among the number of combinationable cases (for example, M+NCM+N−K).

Further, when the target value is not satisfied for all combinations of positions of K bits among M+N bits in the information storage table managed by the virtual basic region, the analyzing device 200 determines that the data cannot be stored (or the information storage table 110 cannot be successfully managed) and ends the entire processes.

Further, the analyzing device 200 determines whether analysis on all of the plurality of information storage tables 100 (for example, including an information storage table managed by the physical basic regions and an information storage table managed by the virtual basic regions) is completed (or ends).

As the determining result, when the analysis on all the information storage tables 110 is completed (or storage in all the information storage table 110 and the position information vector storage space is completed), the analyzing device 200 determines that the data is successfully stored (or the plurality of information storage tables 110 is successfully managed) and ends the entire processes.

Further, as the determining result, when the analysis on all the information storage tables 110 is not completed (or the storage for all the information storage table 110 and the position information vector storage space is not completed), the analyzing device 200 resets the target value. Here, the reset target value may be equal to or different from the previous target value.

Further, after resetting the target value, the analyzing device 200 returns to a step of selecting an information storage table to be analyzed to repeatedly perform the previous entire processes until the analysis on all the information storage table and the position information vector storage space is completed.

As described above, when the selected information storage table 110 is an information storage table managed by the virtual basic regions, the analyzing device 200 checks a combination of physical sub regions which satisfy the target value for the virtual basic regions in all configurable combinations for the plurality of physical sub regions for all of the information storage tables 100. When the selected information storage table 110 is an information storage table managed by the physical basic regions, the analyzing device 200 checks whether to satisfy the target value for information management in the physical basic regions.

Further, when the target value is not satisfied for all combinations of positions of K bits among M+N bits in the information storage table managed by the virtual basic regions or the target value is not satisfied in the information storage table managed by the physical basic regions, the analyzing device 200 determines that the data cannot be stored (or the information storage table 110 cannot be successfully managed) and ends the entire processes.

Figure 2A:
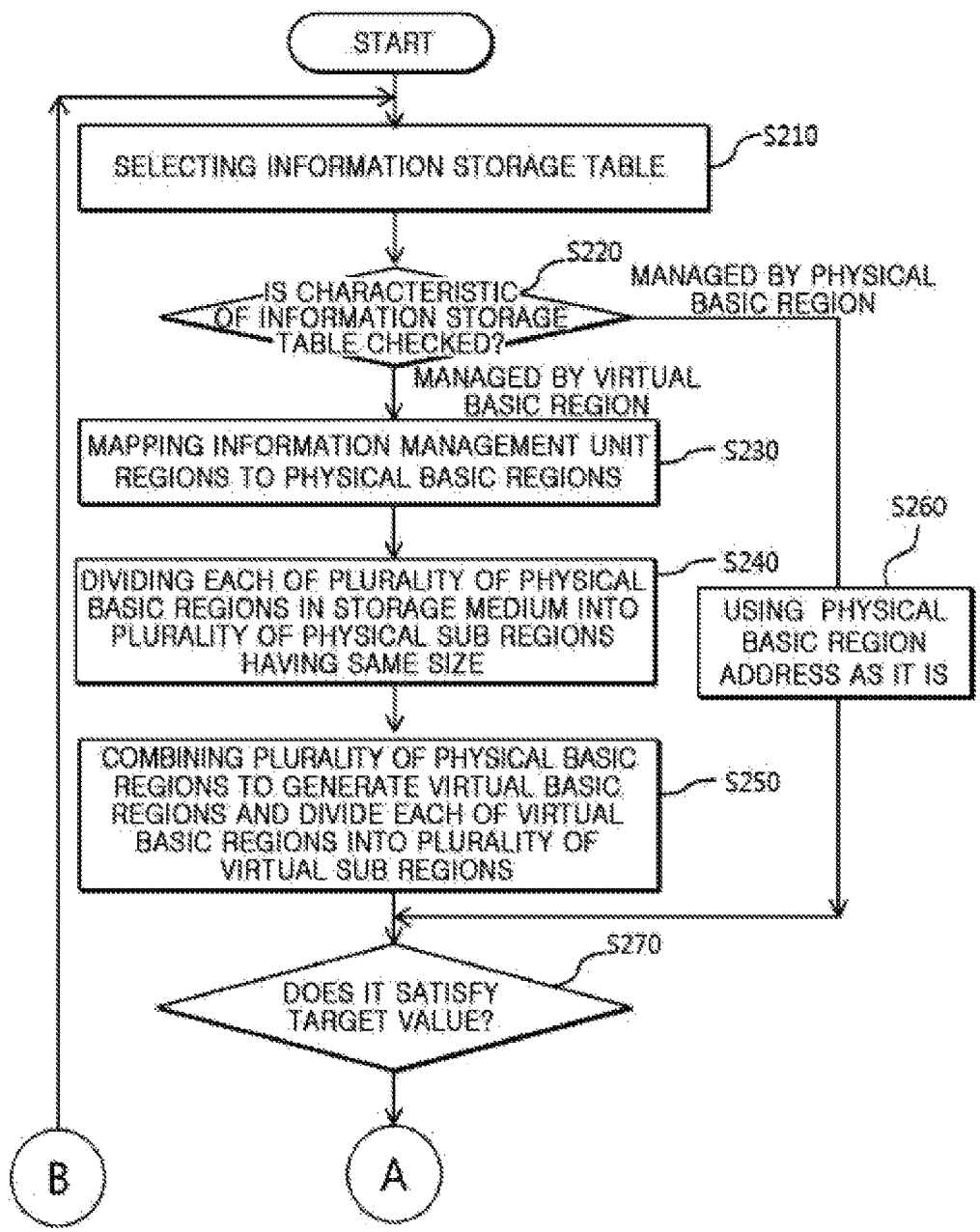
FIGS. 2A and 2B are flowcharts illustrating an operation of an analyzing device for managing a plurality of information storage tables managed by separate virtual regions.
Figure 2B:
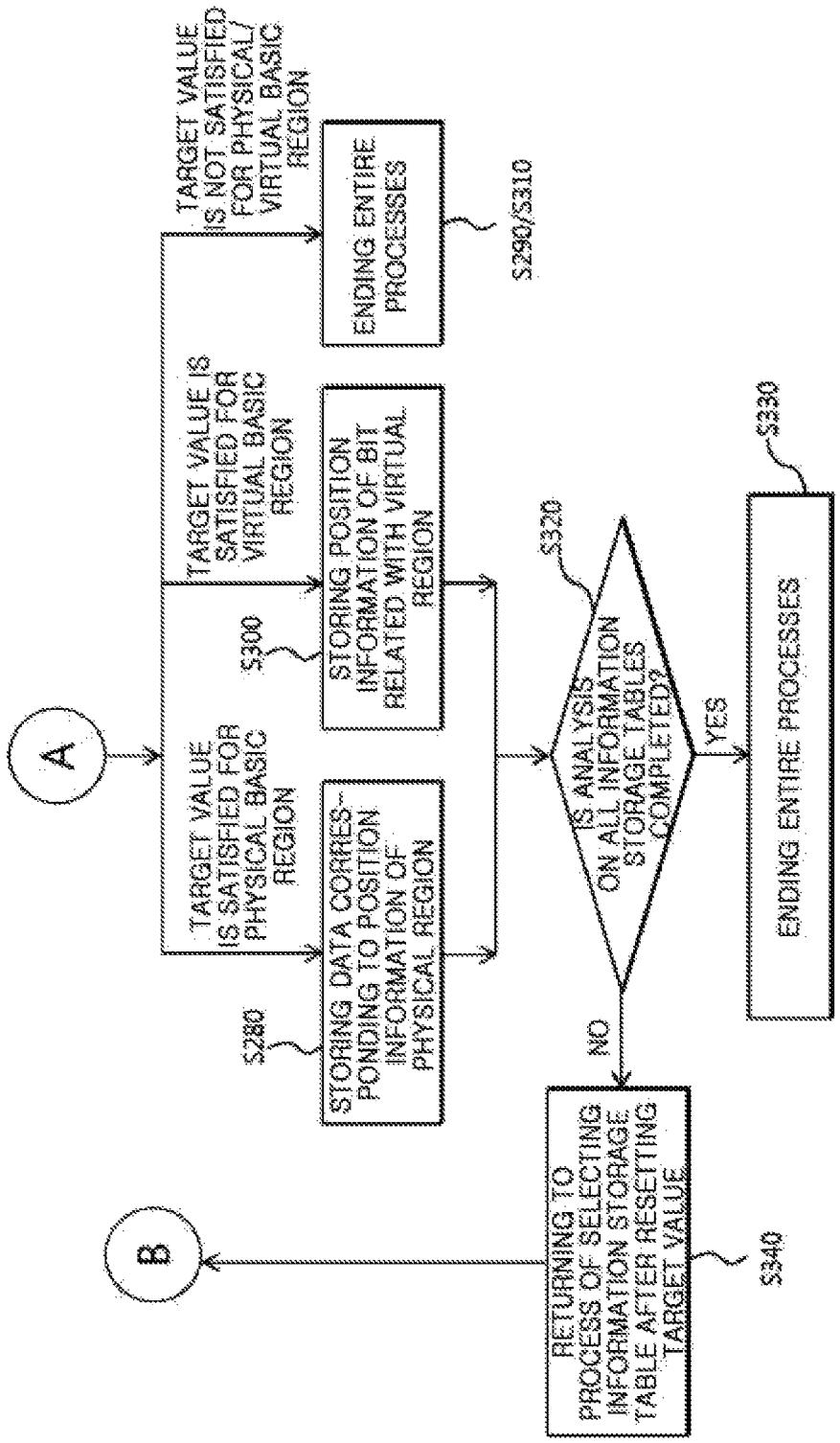

FIGS. 2A and 2B are flowcharts illustrating an operation of an analyzing device for managing a plurality of information storage tables managed by separate virtual regions.

First, the analyzing device 200 selects one or more information storage tables to be analyzed (or managed) from the plurality of information storage tables 110 (S210).

Thereafter, the analyzing device 200 determines (or checks) whether the selected information storage table is an information storage table managed by the physical basic regions or an information storage table managed by the virtual basic regions (S220).

As a determining result (or a checking result), when the selected information storage table is an information storage table managed by virtual basic regions, the analyzing device 200 maps information management unit regions (or unit regions) hashing the information storage location to physical basic regions in the information storage table (or the selected information storage table managed by the virtual basic regions) 110. Here, the information storage table (or the selected information storage table managed by the virtual basic regions) 110 is included in the storage medium 100 and configured by a plurality of unit regions.

In this case, when unit regions in which the information is to be stored and managed in the memory system such as a DRAM, a PCM, an MRAM, or a SRAM are banks, the analyzing device 200 combines all rows in one bank and divides all the combined rows into $2^M$ physical basic regions and maps the unit regions to the divided $2^M$ physical basic regions.

Further, when the number of unit regions to be managed in the storage medium 100 is not $2^M$, the analyzing device 200 may make a plurality of unit regions in the storage medium 100 to be 2M, and then map the new 2M unit regions to the 2M physical basic regions. Here, M may be a natural number.

That is, in order to configure 2M unit regions according to the design of the designer, when the number of unit regions is not 2M, the analyzing device 200 performs a preprocessing process of mapping existing unit regions to 2M new unit regions according to the design of the designer and maps the 2M preprocessed unit regions to the 2M physical basic region.

For example, the analyzing device 200 maps unit regions in the information storage table 110 to physical basic regions (S230).

Thereafter, the analyzing device 200 divides each of the plurality of physical basic regions in the storage medium 100 (or the information storage table/the selected information storage table 110 managed by the virtual basic regions) into a plurality of physical sub regions. Each of the plurality of physical sub regions has same size.

That is, the analyzing device 200 divides each of the 2M physical basic regions in the storage medium 100 (or the information storage table/the selected information storage table 110 managed by the virtual basic regions) into 2N physical sub regions having same size. Here, N may be a natural number. In this case, when one physical basic region is divided into N physical sub regions to be hashed, an additional bit may be required to index the physical sub regions (S240).

Thereafter, the analyzing device 200 combines (or configures) 2M+N physical sub regions indexed by M+N bits to generate 2K virtual basic regions. In this case, K is a natural number and may be equal to or smaller than M+N. Here, when bits for approaching the physical basic region are M bits and bits for approaching the physical sub region are N bits, a number of combinationable cases to generate the virtual basic region is M+NCM+N−K. Further, the size of K may be a bit rate to approach the information storage table 110.

Further, the analyzing device 200 divides (or resets) the generated 2K virtual basic regions into 2M+N−K virtual sub regions having same size.

That is, the analyzing device 200 combines the physical sub regions and sets a key value of the virtual basic regions in the unit of bit which is set in advance from the most significant bit to the least significant bit and sets a bit (or a remaining region) remaining after setting the key value of the virtual basic regions among the M+N bits as a key value of the virtual sub regions to configure the key of the entire virtual regions. The entire virtual regions includes virtual basic regions and virtual sub regions. Here, the analyzing device 200 generates position information of K bits for obtaining the key value of the virtual basic regions and position information of M+N−K bits for obtaining the key value of the virtual sub regions, in order to configure the key (or a key of the entire virtual region) of the virtual regions.

As described above, when the selected information storage table is an information storage table managed by the virtual basic regions, the analyzing device 200 may configure a hash function for obtaining (or setting) the key value of the virtual basic regions using the position information of K bits among the M+N bits and for obtaining the key value of the virtual sub regions using position information of a bit remaining after setting the key value of the virtual basic regions among the M+N bits. Here, the hash function provides position information (for example, including position information of K bits and position information of M+N−K bits) related with the virtual regions based on physical regions addresses (S250).

Further, as the determining result (or the checking result), when the selected information storage table is an information storage table managed by the physical basic regions, the analyzing device 200 may approach the information storage table using an address of the physical basic region as it is, without performing the preprocessing process and the mapping process on the information storage table managed by the virtual basic regions regardless of the number of physical basic regions (S260).

Thereafter, the analyzing device 200 checks whether the number of information (or the number of combined/recombined information) to be stored in the physical basic regions (or when the selected information storage table is an information storage table managed by the physical basic regions) or the temporarily combined (or configured) virtual basic regions (or when the combination of virtual basic regions/the selected information storage table is an information storage table managed by the virtual basic regions) satisfies a predetermined target value. Here, the target value is a value (or a value to satisfy the information to be stored) which is set in advance corresponding to information to be stored. In the case of a memory system which applies memory repair (or memory recovery) using a redundant cell, the target value may be a predetermined number (including, for example, a number of spare rows and a number of spare columns) which is same with the number of available (or available in the memory system) spare cells which are provided in the memory system. That is, the target value may be same with the number of resources which may be available in all of the mapped physical basic regions with a predetermined value corresponding to the information to be stored. Further, in the case of a memory system which avoids a fault memory block, the target value may be same with the number of memory blocks which are available in all of the physical regions of the memory system (S270).

As the checking result, when the number of information to be stored in the physical basic regions (or when the selected information storage table is an information storage table managed by the physical basic regions) satisfies the target value, the analyzing device 200 stores data corresponding to the position information (or the position information on the physical region) of the physical region based on the address of the physical basic region. Here, the data (or information) includes fault information, position information of a fault, routing information, and packet information. Further, the data (or information) may vary depending on a field (for example, including a memory field or a data communication field) to which the analyzing system 10 is applied and may be applied by being modified by a design of a designer. For example, in the case of a memory system which applies a memory repair using a redundant cell, the data (or information) may be a position (or position information) of a fault cell which is replaced by a spare cell which is provided in the memory system (S280).

Further, as the checking result, when the number of information to be stored in the physical basic regions (or the selected information storage table is an information storage table managed by the physical basic regions) does not satisfy the target value, the analyzing device 200 determines that the information storage table (or the information storage table managed by the physical basic regions) cannot be stored (or the information storage able 110 is not successfully managed) and ends the entire process (S290).

Further, as the checking result, when the number (or the number of combined/recombined information) of information to be stored in the temporarily combined virtual basic regions (or when the combination of the virtual basic region/the selected information storage table is an information storage table managed by the virtual basic regions) satisfies the target value, the analyzing device 200 stores position information of K bits related with the virtual basic region which satisfies the target value and position information of M+N−K bits related with the virtual sub region which satisfies the target value, among the M+N bits in a predetermined (or previously allocated) storage region in the storage medium 100. Here, a value of the position information of K bits and a value of the position information of M+N−K bits are configured as a vector and positions of the bits are configured by "0" corresponding to the key value (or a position of K bit) of the virtual basic region and "1" corresponding to the key value (or a position of M+N−K bits) of the virtual sub region.

That is, when the number of information (or the number of combined/recombined information) to be stored in the combined (or configured/generated) virtual basic regions (or when a combination of the virtual basic regions/the selected information storage table is an information storage table managed by the virtual basic regions) satisfies the target value, the analyzing device 200 generates a position of K bits corresponding to the virtual basic region which satisfies the target value and a position of M+N−K bits corresponding to the virtual sub region which satisfies the target value, among the M+N bits. Further, the analyzing device 200 stores the generated position (or position information of K bits) of K bits and the generated position (or position information of M+N−K bits) of M+N−K bits as vectors in the predetermined storage region in the storage medium 100.

Further, the analyzing device 200 stores data corresponding to the position information of the physical region (or position information on the physical region) based on the address of the virtual basic region calculated using the stored position information vector (S300).

Further, as the checking result, when the number of information (or the number of combined/recombined information) to be stored in the temporarily combined virtual basic region (or when the combination of the virtual basic regions/the selected information storage table is an information storage table managed by the virtual basic regions) does not satisfy the target value, the analyzing device 200 repeatedly performs a process of recombining the plurality of physical sub regions according to a predetermined hashing method (or based on a predetermined hash function/with respect to another position of K bits) to check the recombined virtual basic region and checking whether the number of information to be stored in the checked recombined virtual basic region satisfies the predetermined target value except a previously combined case (a plurality of combined cases according to the hashing method/the plurality of recombined cases) among the number of combinationable cases (for example, $_{M+N}C_{M+N-K}$).

Further, when the target value is not satisfied for all combinations of positions of K bits among M+N bits in the information storage table managed by the virtual basic regions, the analyzing device 200 determines that the data cannot be stored (or the information storage table 110 cannot be successfully managed) and ends the entire processes (S310).

Thereafter, the analyzing device 200 determines whether analysis on all the information storage tables 110 is completed (S320).

As the determining result, when the analysis on all the information storage tables 110 is completed (or storage in all the information storage table 110 and the position information vector storage space is completed), the analyzing device 200 determines that the data is successfully stored (or the plurality of information storage tables 110 is successfully managed) and ends the entire processes (S330).

Further, as the determining result, when the analysis on all the information storage tables 110 is not completed (or the storage for all the information storage table 110 and the position information vector storage space is not completed), the analyzing device 200 resets the target value. Here, the reset target value may be equal to or different from the previous target value.

Further, after resetting the target value, the analyzing device 200 returns to a step (S210) of selecting an information storage table to be analyzed to repeatedly perform the previous entire processes (for example, steps S210 to S330) until the analysis on all the information storage table and the position information vector storage space is completed.

Figure 3:
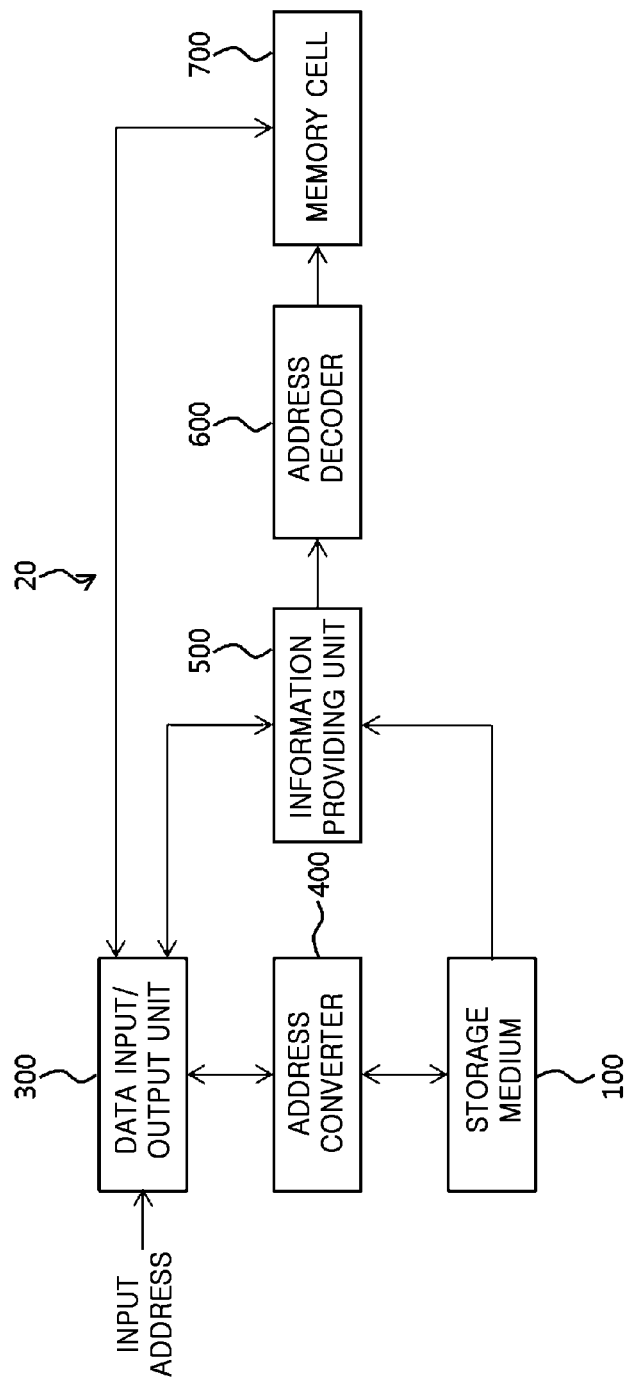
FIG. 3 is a block diagram illustrating a configuration of a memory apparatus which applies fault repair based on a physical region and a virtual region.

FIG. 3 is a block diagram illustrating a configuration of a memory apparatus 20 which applies fault repair based on a physical region and a virtual region.

As illustrated in FIG. 3, the memory apparatus (or a memory device) 20 includes a storage medium 100, a data input/output unit 300, an address converter 400, an information providing unit 500, an address decoder 600 and a memory cell 700. However, all the constituent elements of the memory apparatus 20 illustrated in FIG. 3 are not essential constituent elements, and the memory apparatus 20 may be implemented by more constituent elements than the constituent elements illustrated in FIG. 3 or less constituent elements therethan.

As illustrated in FIG. 1, the storage medium 100 includes a plurality of information storage tables 110. Further, the plurality of information storage tables 110 includes one or more of information storage tables managed by physical basic regions and/or one or more of information storage tales managed by virtual basic regions. A management method and the number of information storage tables may vary depending on intension (or design) of a designer.

That is, the plurality of information storage tables 110 may be configured by only information storage tables managed by the virtual basic regions or configured by only information storage tables managed by the physical basic regions or the plurality of information storage tables 110 may be configured by mixture of information storage tables managed by the virtual basic regions and information storage tables managed by the physical basic regions.

Further, the storage medium 100 (or the information storage table 110) stores a plurality of position information vectors corresponding to the plurality of combinations of virtual regions in a predetermined storage region in the storage medium 100 by control of the analyzing device 200.

Further, the storage medium 100 (or the information storage table 110) stores data corresponding to the position information of the physical regions (or position information on the physical regions) or the position information of the virtual regions (or position information on the virtual regions) in the information storage table 110 (or a fault address storage space corresponding to a position information vector in the storage medium 100) based on the physical basic region address or the position information vector stored in the storage region, by the control of the analyzing device 200. In this case, since the position information vector corresponding to the information storage table 110 managed by the virtual basic regions is required, the number of position information vectors may be equal to or smaller than the number of information storage tables 110. Here, the data (or information) includes fault information, position information of a fault, routing information, and packet information. Further, the data (or information) may vary depending on a field (for example, including a memory field or a data communication field) to which the analyzing system 10 is applied and may be applied by being modified by a design of a designer. For example, in the case of a memory system which applies a memory repair using a redundant cell, the data (or information) may be a position (or position information) of a fault cell which is replaced by a spare cell which is provided in the memory system.

Further, the storage medium 100 stores a plurality of column addresses and a plurality of row addresses (or including fault position information).

The data input/output unit 300 receives a memory request for approaching the memory apparatus 20 (or the memory cell 700) which is transmitted from an apparatus (or a device, not illustrated). Here, the apparatus (or device) may include a cache (not illustrated), a CPU (not illustrated), or an upper level memory (not illustrated) which requests data. In this case, the memory request includes an input address (or address), a command (for example, including a read command or a write command), and write data.

When the read command is included in the memory request, the data input/output unit 300 temporarily stores data corresponding to an input address included in the memory request output from the memory cell 700.

Further, the data output unit 300 provides data corresponding to the input address which is included in the temporarily stored memory request to the apparatus (or device) which requests the data.

When there are an input address included in the memory request received from the data input/output unit 300 and a plurality of position information vector values (or a plurality of position information vectors) stored in a predetermined (or previously allocated) storage region in the storage medium 100 (or information storage table 100), the address converter 400 calculates the input address and the position information vector values (or the plurality of position information vector values) to convert a physical basic region address into a plurality of virtual basic region addresses.

That is, when there are the input address and the position information vector included in the memory request, the address converter 400 converts each physical basic region address into a plurality of virtual basic regions addresses corresponding to each position information vector value using a plurality of position information vector values for one input address. In this case, the number of converted addresses of virtual basic regions is equal to the number of position information vectors.

When there is no position information vector for the input address, the address converter 400 outputs the address of the physical basic region as it is without performing the converting process (for example, a process of calculating the input address and the position information vector value to convert the physical basic region address into the plurality of virtual basic region addresses).

The information providing unit 500 checks spare cell information (for example, including information on a spare column which replaces the fault address and information on a spare row which replaces the fault address) which replaces the fault address in a plurality of fault address storage spaces of the storage medium 100 based on the virtual basic region address which is converted by means of the address converter 400, the physical basic region address, a plurality of column addresses/row addresses which is set (registered/stored) in advance in the storage medium 100, and the input address.

Further, the information providing unit 500 selects an address (or a final address) based on the spare cell information by which the checked fault address is replaced, the input address and the plurality of column addresses/row addresses which is set in advance in the storage medium 100.

That is, when the input address is any one of the plurality of column addresses and/or row addresses (for example, including fault addresses) which is set in advance, the information providing unit 500 selects a value (or address/final address) obtained by replacing the fault address with an address of the spare cell.

Further, when the input address is none of the plurality of column addresses and/or row addresses which is set in advance (or when the input address is different from the fault address), the information providing unit 500 selects the input address as a final address.

The information providing unit 500 provides the selected address to the address decoder 600. Here, the selected address (or the final address) may be any one of an address corresponding to a value obtained by replacing the fault address with the address of the spare cell and the input address.

As described above, the input address is replaced from the fault address to an address of the spare cell to approach an address of the spare cell, rather than an address in which fault is caused. In this case, the fault repair using the spare row is replaced by a spare row which belongs to the physical address region for the purpose of efficiency and the fault repair using a spare column is replaced by a spare column which belongs to the virtual region area. Further, the positions of the spare row and the spare column are not limited. However, the physical address region performs fault repair using a spare column and the virtual address region may perform fault repair using the spare row in accordance with the design of the designer.

The address decoder 600 includes a row decoder and a column address.

That is, the address decoder 600 provides position information of data corresponding to an address (or data to be read corresponding to the selected address) to the memory cell 700 based on the address (or the final address) provided from the information providing unit 500.

That is, when the address (or the final address) is a value (or address) obtained by replacing the fault address with the address of the spare cell, the address decoder 600 provides position information of data corresponding to the address of the spare cell to the memory cell 700.

Further, when the address (or the final address) is the above-mentioned input address, the address decoder 600 provides the position information of data corresponding to the input address to the memory cell 700.

The memory cell 700 performs any one of a read command function and a write command function included in the memory request based on the position information of the data corresponding to the address (or the final address) provided from the decoder 600 and the memory request received through the data input/output unit 300.

That is, when the read command is included in the memory request, the memory cell 700 reads data to be output to the outside, related with the position information of data corresponding to the address (or the final address) from the position corresponding to the position information (or the position information of data corresponding to the final address) of the corresponding data in the memory cell 700.

Further, when the write command is included in the memory request, the memory cell 700 stores write data in a specific position in the memory cell 600 based on the position information of data corresponding to the write data included in the memory request and the address (or the final address).

Figure 4:
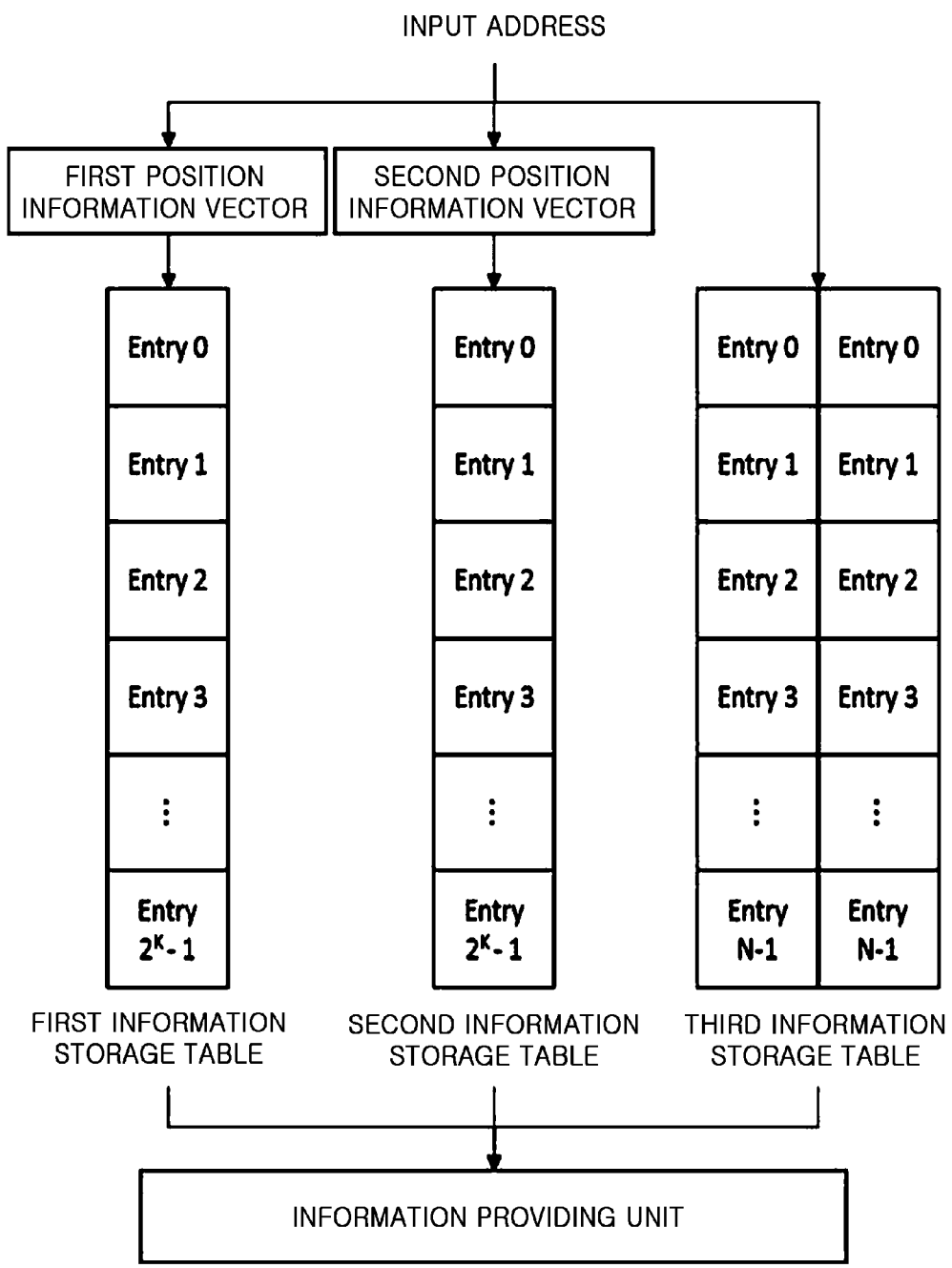
FIG. 4 is a block diagram specifically illustrating a part of a configuration of a memory apparatus which applies fault repair based on a plurality of information storage tables managed by separate physical regions and separate virtual regions.

FIG. 4 is a block diagram specifically illustrating a part of a configuration of a memory apparatus which applies fault repair based on a plurality of information storage tables managed by separate physical regions and separate virtual regions.

When the input address is input through the data input/output unit 300, the address converter 400 calculates the plurality of position information vectors (for example, a first position information vector or a second position information vector) stored in the storage medium 100 and the input address to generate (or convert) a plurality of virtual region addresses. Here, the plurality of generated (or converted) virtual region addresses is used as an index to approach the first information storage table or the second information storage table. Further, a third information storage table illustrated in FIG. 4 is an information storage table which is managed by the physical regions. It is possible to approach the third information storage table using the physical region address which is an input address (or a part of the input address) as an index without converting the address.

The address converter 400 approaches entries of the plurality of information storage tables 100 in the storage medium 100 based on the plurality of generated (or converted) virtual region addresses and physical region addresses to obtain information (or including data and fault position information).

For example, as illustrated in FIG. 4, the address converter 400 generates a virtual address for approaching the second information storage table by calculating the second position information vector and the input address and approaches the second information storage table based on the generated virtual address of the second storage table to obtain information (or data, the fault position information and so on).

As another example, the address converter 400 approaches the third information storage table based on the physical region address which is the input address (or a part of the input address) to obtain information (or data, the fault position information and so on).

Further, in the memory system which applies memory repair using a redundant cell, information stored by each entry of the information storage table 110 may be information of a fault cell which is replaced with the spare cell.

Further, N which is the number of physical basic regions may be equal to or different from 2K which is the number of virtual basic regions. Therefore, the number of entries corresponding to each spare cell in the information storage table 110 managed by the physical basic regions may be N. Therefore, the number of entries corresponding to each spare cell in the information storage table 110 managed by the virtual basic regions may be 2K. Here, the values of N and 2K may vary depending on the design of designer.

Further, the address converter 400 provides the obtained information to the information providing unit 500.

Further, the information providing unit 500 selects an address using the obtained information.

That is, the information providing unit 500 compares the input address and the obtained information to select an address.

Figure 5:
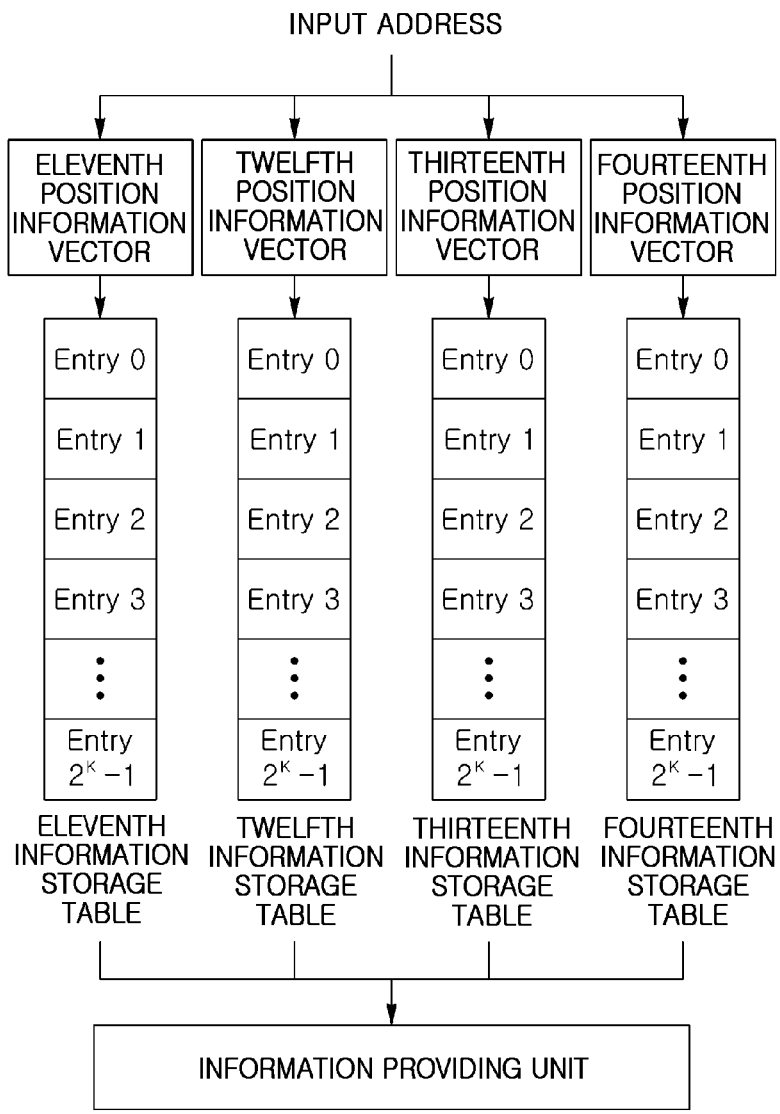
FIG. 5 is a block diagram specifically illustrating a part of a configuration of a memory apparatus which applies fault repair based on a plurality of information storage tables managed only by separate virtual regions.

FIG. 5 is a block diagram specifically illustrating a part of a configuration of a memory apparatus which applies fault repair based on a plurality of information storage tables managed only by separate virtual regions. In FIG. 5, there is no information storage table managed by physical basic regions according to the design of the designer. Further, as illustrated in FIGS. 4 and 5, a configuration and a management method of each information storage table may vary according to a purpose (or a design purpose) of the designer.

When the input address is input through the data input/output unit 300, the address converter 400 calculates the plurality of position information vectors (for example, an eleventh position information vector or a fourteenth position information vector) stored in the storage medium 100 and the input address to generate (or convert) a plurality of virtual region addresses corresponding to a plurality of storage tables.

Thereafter, the address converter 400 approaches entries of the plurality of information storage tables in the storage medium 100 based on the generated virtual region address to obtain information (or data or fault position information).

For example, as illustrated in FIG. 5, the address converter 400 generates a virtual region address of a thirteenth information storage table by calculating the input address and a thirteenth position information vector and approaches the thirteenth position information storage table using the generated virtual region address of the thirteenth information storage table to obtain information (or data or fault position information).

Further, in the memory system which applies memory repair using a redundant cell, information stored by each entry of the information storage table may be information of a fault cell which is replaced with the spare cell.

The information obtained through the address converter 400 is provided to the information providing unit 500 to be used to select an address by being compared with the input address.

Figure 6:
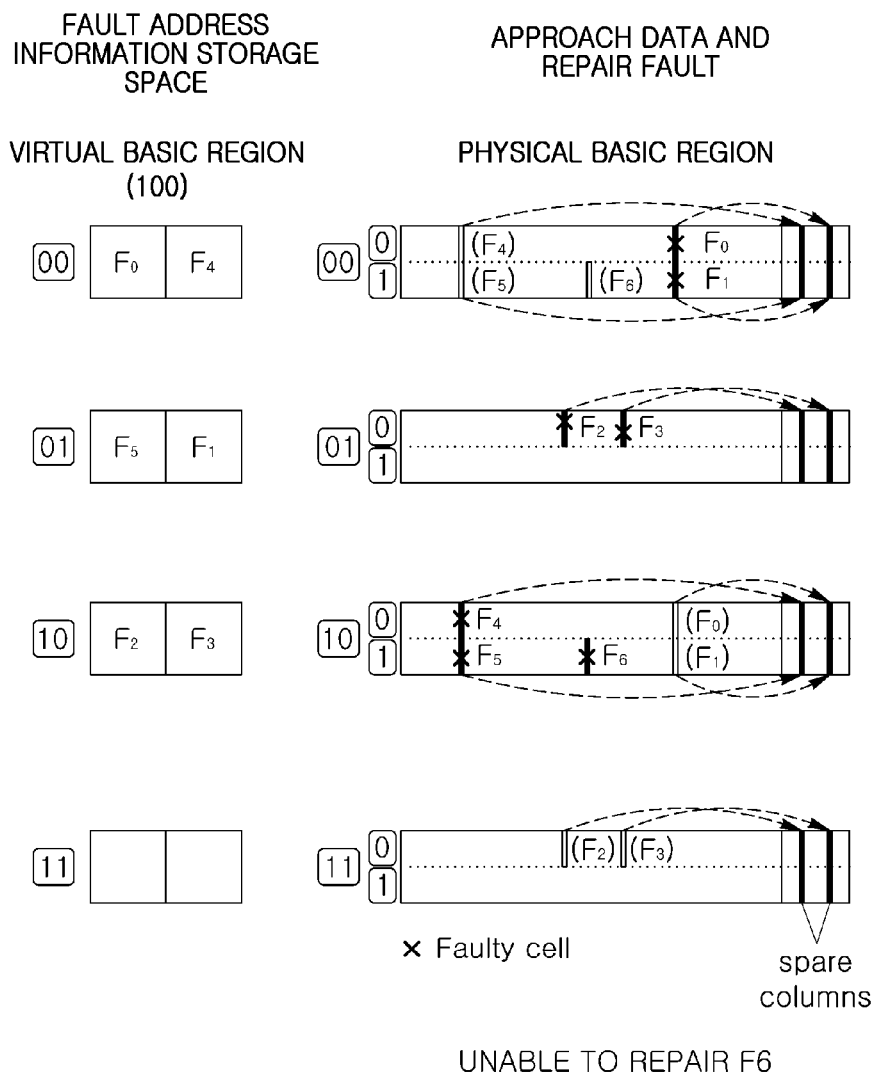
FIG. 6 is a view illustrating an example which applies a fault repair in a memory system having one position information vector.
Figure 7:
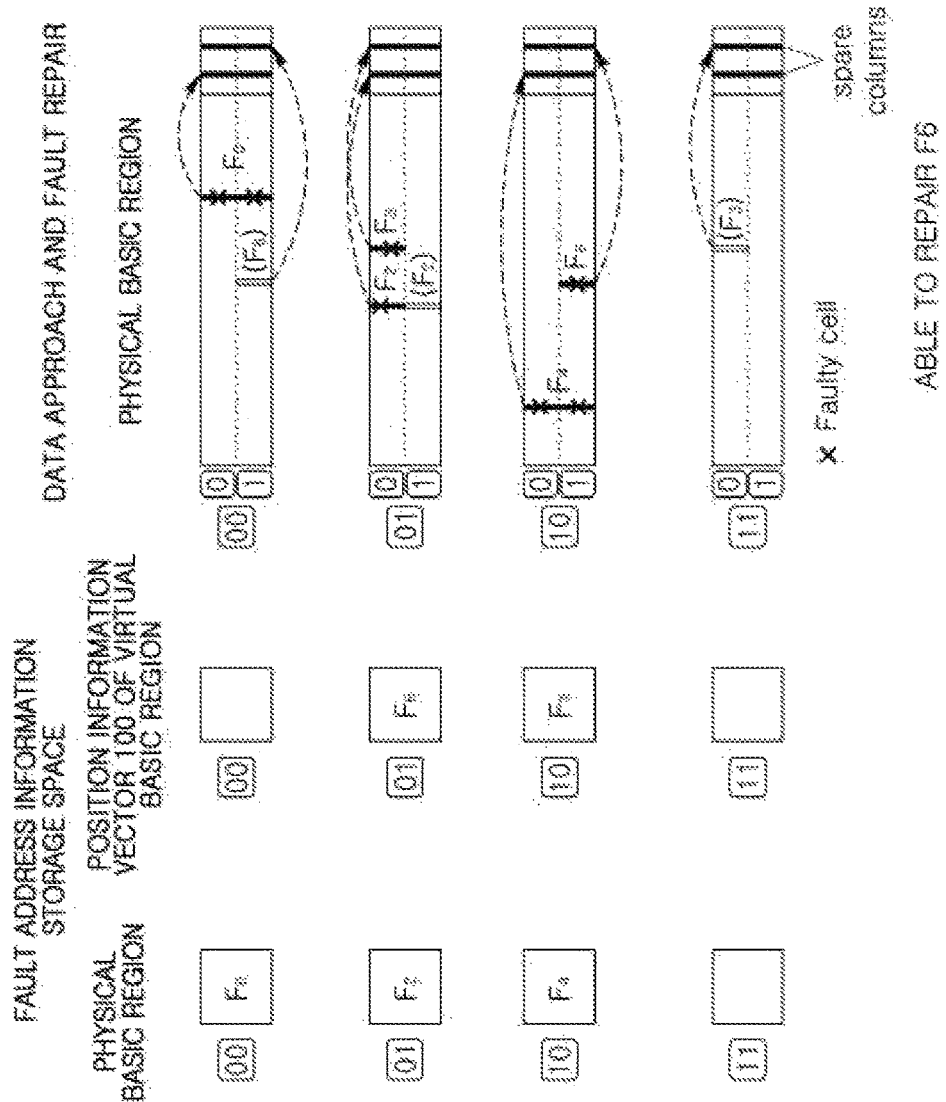
FIG. 7 is a view illustrating an example which applies fault repair in a system which performs fault repair based on a plurality of information storage tables.

FIG. 6 is a view illustrating an example which applies a fault repair in a memory system having one position information vector and FIG. 7 is a view illustrating an example which applies fault repair in a system which performs fault repair based on a plurality of information storage tables.

As illustrated in FIG. 6, each region has two spare columns and thus the fault address information storage space managed by the virtual region has two entries corresponding to individual spare columns.

Further, a position information vector corresponding to the virtual region is "100" and F0 and F1 are located on the same column of a physical basic region "00", and F4 and F5 are also located on the same column of a physical basic region "10".

Further, in FIG. 6, according to the position information vector value "100", a virtual basic region "00" is configured by a physical region "000" and a physical region "100", a virtual basic region "01" is configured by a physical region "001" and a physical region "101", a virtual basic region "10" is configured by a physical region "010" and a physical region "110", and a virtual basic region "11" is configured by a physical region "011" and a physical region "111".

Further, when a fault occurs as illustrated in FIG. 6, F0 and F1 are mapped to different virtual basic regions and F4 and F5 are mapped to different virtual basic regions. Since a maximum number of fault address information which can be stored in each virtual basic region is two, a fault F6 is not repaired because there is no remaining entry in the fault address information storage space, so that the fault repair fails.

As illustrated in FIG. 7, each region has two spare columns and also has a fault address information storage space corresponding to each spare column. Here, one of the fault address information storage spaces is managed by being indexed with the address of the physical basic region and the other one is managed by being indexed with an address of the virtual basic region configured by the position information vector 100.

Further, since the number of fault address information storage spaces is equal to the number of spare columns, the number of spare columns corresponding to one fault address information storage space is one.

Further, a first spare column corresponds to a fault address information storage space managed by the physical basic regions and a second spare column corresponds to a fault address information storage space which is managed by the virtual basic regions and has a position information vector "100".

Since F0 and F1 are located on the same column of a physical basic region "00", in FIG. 7, F0 and F1 of FIG. 6 are illustrated as F0. Further, since F4 and F5 are located on the same column of a physical basic region "10", in FIG. 7, F4 and F5 of FIG. 6 are illustrated as F4.

Further, the second fault address information storage space is managed by the position information vector "100". In this case, a virtual basic region "00" is configured by a physical region "000" and a physical region "100", a virtual basic region "01" is configured by a physical region "001" and a physical region "101", a virtual basic region "10" is configured by a physical region "010" and a physical region "110", and a virtual basic region "11" is configured by a physical region "011" and a physical region "111".

In FIG. 7, even though the number of faults of F0 is two, the faults may be replaced with one spare column. Therefore, F0 is stored in an entry "00" of the fault address information storage space managed by the physical basic region. Further, F2 is stored in an entry "01" of the fault address information storage space managed by the physical basic region and in this case, F2 is also replaced with the first spare column. Further, F4 is stored in an entry "10" of the fault address information storage space managed by the physical basic region. However, even though F4 has two faults, two faults are located on the same column in the same region so that the faults may be replaced with one spare column.

F6 is stored in an entry "01" of the fault address information storage space managed by the position information vector "100". In this case, an address corresponding to F6 and located on the same column in the same region is also replaced with a spare column. Further, F3 is stored in an entry "10" of the fault address information storage space managed by the position information vector "100". In this case, an address corresponding to F3 and located on the same column in the same region is also replaced with a spare column.

As described above, as illustrated in FIGS. 6 and 7, the number of faults and the number of spare columns in the memory systems in FIGS. 6 and 7 are the same. However, the fault which is not repaired in the memory system in FIG. 6 may be repaired in the memory system in FIG. 7 since the fault address storage spare is managed by both physical regions and virtual regions in FIG. 7, respectively, unlike the memory system in FIG. 6.

Further, as described above, the fault repair may be applied in the memory system having a plurality of a plurality of information storage tables managed by separate virtual regions.

Furthermore, as described above, when a column fault is caused over several physical sub regions using the plurality of information storage tables, fault information may be stored in the plurality of information storage tables managed by separate combinations of virtual regions.

Hereinafter, a control method of a memory apparatus which applies fault repair based on a plurality of information storage tables managed by separate virtual regions will be described in detail with reference to FIGS. 1 to 8.

Figure 8:
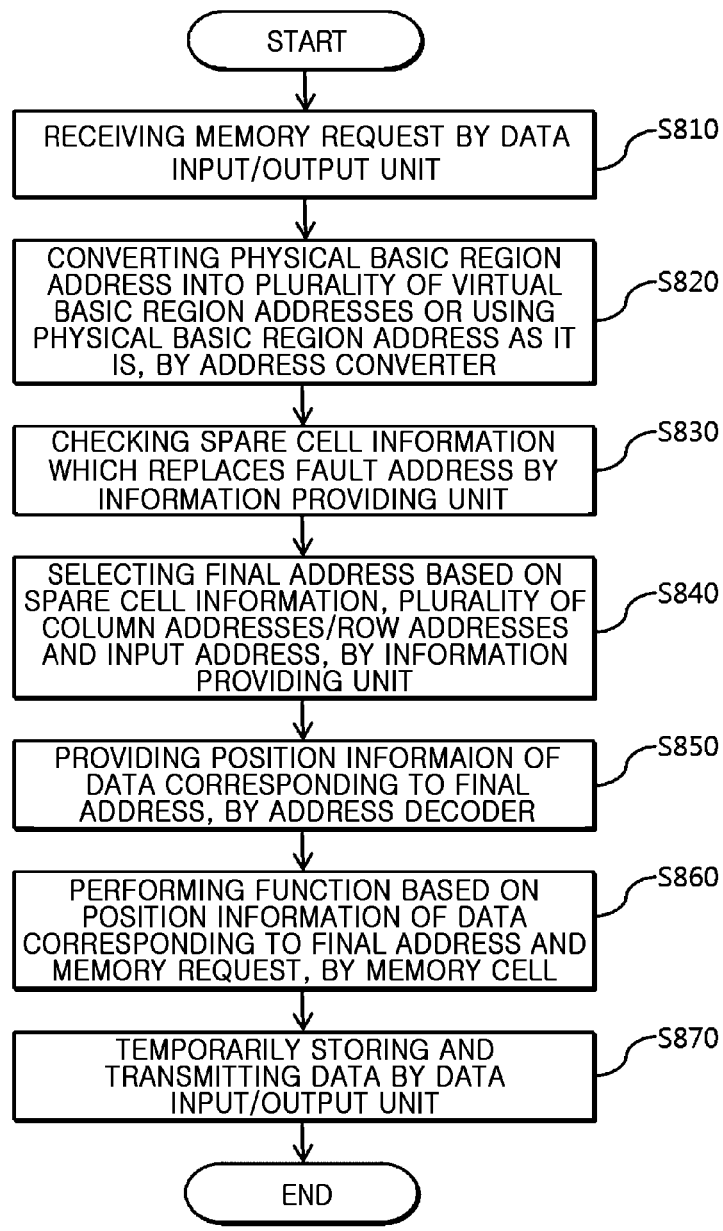
FIG. 8 is a flowchart illustrating a control method of a memory apparatus which applies fault repair based on a plurality of information storage tables managed by separate virtual regions.

FIG. 8 is a flowchart illustrating a control method of a memory apparatus which applies fault repair based on a plurality of information storage tables managed by separate virtual regions.

First, the data input/output unit 300 receives a memory request for approaching the memory apparatus 20 (or the memory cell 700) which is transmitted from a device (or an apparatus, not illustrated). Here, the device (or the apparatus) may include a cache (not illustrated), a CPU (not illustrated), or an upper level memory (not illustrated) which requests data. In this case, the memory request includes an input address (or address), a command (for example, including a read command or a write command), and write data.

For example, the data input/output unit 300 receives a first memory request which is transmitted from a CPU to approach (for example, perform a data read command) the data in the memory cell 700. Here, the first memory request includes a first input address and a first read command.

As another example, the data input/output unit 300 receives a second memory request which is transmitted from an upper level memory to approach (for example, perform a data write command) the data in the memory cell 700. Here, the second memory request includes a second input address, a second write command, and second write data in step S810.

Thereafter, the address converter 400 calculates an input address included in the memory request received from the data input/output unit 300 and a plurality of position information vectors stored in a predetermined (or previously allocated) storage region in the storage medium 100 (or the information storage table 110) to convert a physical basic region address into a plurality of virtual basic region addresses. In this case, the address converter 400 does not perform an address converting process on the information storage table 100 managed by a physical region in which a position information vector is not presented, but outputs the physical basic region address configured by the input address (or a part of the input address) as it is.

For example, as illustrated in FIG. 7, the address converter 400 calculates the first input address with a position information vector "100" related with a virtual region stored in the storage region in the storage medium 100 to calculate a first physical region address "010" corresponding to the first input address and the position information vector "100" to convert the first input address into a second virtual region address and output the first physical basic region address "01" and the second virtual basic region address "10".

As another example, the address converter 400 calculates the second input address with the position information vector "100" related with the virtual region stored in the storage region in the storage medium 100 to convert the eleventh physical basic region address "100" corresponding to the second input address into the twelfth virtual basic region address and outputs the eleventh physical basic region address "10" and the twelfth physical basic region address "00" (S820).

Thereafter, the information providing unit 500 checks spare cell information (for example, including information on a spare column which replaces the fault address and information on a spare row which replaces the fault address) which replaces the fault address in the fault address storage spaces of the storage medium 100 based on the plurality of the virtual basic region addresses which are converted by means of the address converter 400, the physical basic region address, a plurality of column addresses/row addresses which is set (registered/stored) in advance in the storage medium 100, and the input address.

For example, as illustrated in FIG. 7, the information providing unit 500 checks spare cell information (for example, information on a 1-1-th spare column) which replaces fault address (for example, address information on F0 and F1) in an entry 00 of the fault address storage space managed by the physical region in the fault address storage space of the storage medium 100, based on the converted second virtual basic region address, a plurality of column address set in advance in the storage medium 100, and the first input address and checks spare cell information (for example, information on a 1-2-th spare column) which replaces the fault address (for example, address information on F$_6$) in the entry 01 of the fault address storage address managed by the position information vector "100" in the fault address storage space of the storage medium 100.

As another example, the information providing unit 500 checks spare cell information (for example, including information on an eleventh spare column) which replaces a fault address in the fault address storage space of the storage medium 100 based on the converted eleventh virtual basic region address, the twelfth virtual basic region address, the plurality of column addresses which is set in advance in the storage medium 100, and the second input address (S830).

Thereafter, the information providing unit 500 selects an address (or a final address) based on the spare cell information which replaces the checked fault address and the plurality of column addresses/row addresses which is set in advance in the storage medium 100 and the input address.

That is, when the input address is any one of the plurality of column addresses and/or row addresses which is set in advance, the information providing unit 500 selects a value (or address/final address) obtained by replacing the fault address with an address of the spare cell.

Further, when the input address is none of the plurality of column addresses and/or row addresses which is set in advance (or when the input address is different from the fault address), the information providing unit 500 selects the input address as a final address.

Further, the information providing unit 500 provides the selected address to the address decoder 600. Here, the selected address (or the final address) may be any one of an address corresponding to a value obtained by replacing the fault address with the address of the spare cell and the input address.

For example, as illustrated in FIG. 7, when the first input address is F0, the information providing unit 500 selects an address of the 1-1-th spare column for replacing F0 and provides the selected address of the 1-1-th spare column to the address decoder 500, based on the spare cell information (for example, information on the 1-1-th spare column) which replaces the fault address (for example, address information on F0 and F1) in an entry 00 of the fault address storage space managed by the physical region in the fault address storage space of the storage medium 100, a plurality of column addresses (or fault address, for example, address information on F0 and F1) set in advance in the storage medium 100, and the first input address.

As another example, when the second input address is F4, the information providing unit 500 selects an address of an eleventh spare column which replaces F4 and provides the selected address of the eleventh spare column to the address decoder 600 based on spare cell information (for example, including information on the eleventh spare column) which replaces the fault address in the fault address storage space of the storage medium 100, a plurality of column addresses (or fault addresses) which is set in advance in the storage medium 100, and the second input address (S840).

Thereafter, the address decoder 600 provides position information of data (or data to be read corresponding to the selected address) is provided to the memory cell 700 based on the address (or the final address) provided from the information providing 500.

That is, when the address (or the final address) is a value (or address) obtained by replacing the fault address with the address of the spare cell, the address decoder 600 provides position information of data corresponding to the address of the spare cell to the memory cell 700.

Further, when the address (or the final address) is the above-mentioned input address, the address decoder 600 provides the position information of data corresponding to the input address to the memory cell 700.

For example, the address decoder 600 provides position information of the first data corresponding to the address of the 1-1-th spare column to the memory cell 700.

As another example, the address decoder 600 provides position information of the eleventh data corresponding to the address of the eleventh spare column to the memory cell 700 (S850).

Thereafter, the memory cell 700 performs any one of a read command function and a write command function included in the memory request based on the position information of the data corresponding to the address (or the final address) provided from the decoder 600 and the memory request received through the data input/output unit 300.

That is, when the read command is included in the memory request, the memory cell 700 reads data to be output to the outside, related with the position information of data corresponding to the address (or the final address) from the position corresponding to the position information (or the position information of data corresponding to the final address) of the corresponding data in the memory cell 700.

Further, when the write command is included in the memory request, the memory cell 700 stores write data in a specific position in the memory cell 600 based on the position information of data corresponding to the write data included in the memory request and the address (or the final address).

For example, when the first read command is included in the first memory request, the memory cell 700 reads first data corresponding to the position information of the first data from a specific position in the memory cell 700 based on the position information of the first data.

As another example, when the second write command is included in the second memory request, the memory cell 700 stores the second write data in a specific position in the memory cell 700, based on second write data included in the second memory request and the position information of the eleventh data (S860).

Thereafter, when the read command is included in the memory request, the data input/output unit 300 temporarily stores data corresponding to an input address included in the memory request output from the memory cell 700.

Further, the data output unit 300 provides data corresponding to the input address which is included in the temporarily stored memory request to the apparatus (or device) which requests the data.

For example, when the first read command is included in the memory request, the data input/output unit 300 provides the first data (or first data corresponding to the first input address included in the first memory request) which is read from the memory cell 700 to the CPU which request the first data (S870).

According to the present solution, as described above, a fault repair is applied in a memory system having a plurality of information storage tables managed by a separate virtual region, so that the entire information storage space is uniformly used for every region to improve a performance of the entire system and maximize efficiency of the information storage space by utilizing the information storage space.

Further, as described above, when a column fault is caused over several physical sub regions by using the plurality of information storage tables, fault information is stored in the plurality of information storage tables managed by separate virtual region combinations, thereby improving efficiency of fault repair and increasing a fault repair rate of the memory system.

Changes or modifications of the above description may be made by those skilled in the art without departing from the spirit and scope of the present invention. Therefore, the exemplary embodiments of the present invention are provided for illustrative purposes only but not intended to limit the technical spirit of the present invention. The scope of the technical concept of the present invention is not limited thereto. The protective scope of the present invention should be construed based on the following claims, and all the technical concepts in the equivalent scope thereof should be construed as falling within the scope of the present invention.

According to the present solution, a fault repair is applied in a memory system having a plurality of information storage tables managed by a separate virtual region, so that the entire information storage space is uniformly used for every region to improve a performance of the entire system and maximize efficiency of the information storage space by utilizing the information storage space. Therefore, the present solution may be widely used for an information storage device such as a memory field.

What is claimed is:

1. A control method of a memory apparatus having a plurality of information storage tables, the method comprising:
receiving a memory request transmitted from a device, by means of a data input/output unit;
converting a physical basic region address into a plurality of virtual basic region addresses based on an input address included in the memory request and a plurality of position information vectors stored in a storage region set in a non-transitory storage medium, by means of an address converter;
checking spare cell information which replaces a fault address from the plurality of information storage tables of the non-transitory storage medium based on the plurality of converted virtual basic region addresses, a plurality of column addresses or row addresses set in advance in the non-transitory storage medium, and the input address, by means of an information providing unit;
selecting a final address based on the checked spare cell information which replaces the fault address, the plurality of column addresses or row addresses set in advance in the non-transitory storage medium, and the input address, by means of the information providing unit;
providing position information of data corresponding to the final address, by means of an address decoder; and
performing any one of a read command function and a write command function included in the memory request, based on the position information of the data corresponding to the final address and the memory request, by means of a memory cell in communication therewith that performs read and write functions,
wherein the converting of the physical basic region address into the plurality of virtual basic region addresses includes:
generating a plurality of virtual basic region addresses corresponding to the plurality of information storage tables based on the input address and the plurality of position information vectors, by means of the address converter; and
obtaining information by approaching entries of the plurality of information storage tables in the non-transitory storage medium based on the generated plurality of virtual basic region addresses, by means of the address converter.

2. The method of claim 1, wherein the memory request includes at least one of an input address, a command and write data.

3. The method of claim 1, wherein the spare cell information which replaces the fault address is any one of information on a spare column which replaces the fault address and information on a spare row which replaces the fault address.

4. The method of claim 1, wherein in the checking of spare cell information which replaces the fault address, the input address is replaced to an address of a spare cell from the fault address so that the fault is repaired by accessing the address of the spare cell instead of the fault address.

5. The method of claim 1, wherein in the checking of spare cell information which replaces the fault address, in a case of fault repair using a spare row, the fault address is replaced by an address of a spare row which belongs to a physical address region, and in a case of fault repair using a spare column, the fault address is replaced by an address of a spare column which belongs to a virtual address region.

6. The method of claim 1, wherein the selecting of a final address includes any one of:
selecting, when the input address is any one of the plurality of predetermined column addresses and row addresses, a value obtained by replacing the fault address by an address of a spare cell as the final address, by means of the information providing unit; and
selecting, when the input address is not the fault address, the input address as the final address, by means of the information providing unit.

7. The method of claim 1, wherein the providing of position information of data corresponding to the final address includes any one of:
providing, when the final address is a value obtained by replacing the fault address by an address of the spare cell, position information of data corresponding to an address of the spare cell; and
providing, when the final address is the input address, position information of data corresponding to the input address.

8. The method of claim 1, wherein in the performing of any one of a read command function and a write command function included in the memory request, when the read command is included in the memory request, data to be output to outside related with the position information of data corresponding to the final address is read from a position corresponding to position information of the data in the memory cell.

9. The method of claim 1, wherein in the performing of any one of a read command function and a write command function included in the memory request, when the write command is included in the memory request, the write data is stored in the memory cell based on the write data included in the memory request and the position information of data corresponding to the final address.

10. The method of claim 1, further comprising:
temporarily storing, when the read command is included in the memory request, data corresponding to the input address output from the memory cell, by means of the data input/output unit; and
providing data corresponding to the temporarily stored input address to the device which requests the data, by means of the data input/output unit.

11. The method of claim 1, further comprising:
outputting a physical basic region address configured by the input address or a part of the input address to information storage table managed by a physical region in which the position information vector is not presented, by means of the address converter, without performing the address converting process of converting the physical basic region address into the plurality of virtual basic region addresses; and
checking spare cell information which replaces a fault address from the plurality of information storage tables of the non-transitory storage medium based on the physical basic region address, a plurality of column addresses or row addresses set in advance in the non-transitory storage medium, and the input address, by means of the information providing unit.

12. A memory apparatus having a plurality of information storage tables, the apparatus comprising:
a data input/output unit which receives a memory request transmitted from a device;
an address converter which converts a physical basic region address into a plurality of virtual basic region addresses based on an input address included in the memory request and a plurality of position information vectors stored in a storage region set in a non-transitory storage medium;
an information providing unit which checks spare cell information which replaces a fault address from the plurality of information storage tables of the non-transitory storage medium based on the plurality of converted virtual basic region addresses, the plurality of column address or row addresses set in advance in the non-transitory storage medium, and the input address and selects a final address based on the checked spare cell information which replaces the fault address, the plurality of column address or row addresses set in advance in the non-transitory storage medium, and the input address;
an address decoder which provides position information of data corresponding to the final address; and
a memory cell which performs any one of a read command function and a write command function included in the memory request, based on the position information of the data corresponding to the final address and the memory request,
wherein the address converter generates a plurality of virtual basic region addresses corresponding to the plurality of information storage tables based on the input address and the plurality of position information vectors and approaches entries of the plurality of information storage tables in the non-transitory storage medium based on the plurality of generated virtual region addresses to obtain information.

13. The apparatus of claim 12, wherein the memory request includes at least one of an input address, a command and write data.

14. The apparatus of claim 12, wherein the spare cell information which replaces the fault address is any one of information on a spare column which replaces the fault address and information on a spare row which replaces the fault address.

15. The apparatus of claim 12, wherein, when the input address is any one of the plurality of predetermined column addresses and row addresses, the information providing unit selects a value obtained by replacing the fault address by an address of a spare cell as the final address.

16. The apparatus of claim 12, wherein when the input address is not the fault address, the information providing unit selects the input address as the final address.

17. The apparatus of claim 12, wherein when the final address is a value obtained by replacing the fault address by an address of the spare cell, the address decoder provides position information of data corresponding to the address of the spare cell to the memory cell.

18. The apparatus of claim 12, wherein when the final address is the input address, the address decoder provides position information of data corresponding to the input address to the memory cell.

19. The apparatus of claim 12, wherein when the read command is included in the memory request, the memory cell reads data to be output to outside related with the position information of data corresponding to the final address from a position corresponding to position information of the data in the memory cell.

20. The apparatus of claim 12, wherein when the write command is included in the memory request, the memory cell stores the write data in the memory cell based on the write data included in the memory request and the position information of data corresponding to the final address.

21. The apparatus of claim 12, wherein when the read command is included in the memory request, the data input/output unit temporarily stores data corresponding to the input address output from the memory cell and provides the data corresponding to the temporarily stored input address to the device which requests the data.

22. The apparatus of claim 12, wherein the address converter outputs a physical basic region address configured by the input address or a part of the input address to information storage table managed by a physical region in which the position information vector is not presented, without performing the address converting process of converting the physical basic region address into the plurality of virtual basic region addresses; and the information providing unit checks spare cell information which replaces a fault address from the plurality of information storage tables of the non-transitory storage medium based on the physical basic region address, the plurality of column addresses or row addresses set in advance in the non-transitory storage medium, and the input address.

* * * * *